United States Patent [19]

Stafford et al.

[11] B 3,983,414

[45] Sept. 28, 1976

[54] CHARGE CANCELLING STRUCTURE AND METHOD FOR INTEGRATED CIRCUITS

[75] Inventors: Kenneth R. Stafford; John P. Guadagna, both of San Jose, Calif.

[73] Assignee: Fairchild Camera and Instrument Corporation, Mountain View, Calif.

[22] Filed: Feb. 10, 1975

[21] Appl. No.: 548,302

[44] Published under the second Trial Voluntary Protest Program on February 17, 1976 as document No. B 548,302.

[52] U.S. Cl. ................................ 307/251; 307/304; 357/23

[51] Int. Cl.² ................... H03K 17/16; H03K 17/60

[58] Field of Search ............ 307/251, 304; 328/162; 357/23

[56] References Cited

UNITED STATES PATENTS

| | | | |
|---|---|---|---|
| 3,636,378 | 1/1972 | Ohashi et al. | 307/251 |
| 3,662,356 | 5/1972 | Michon et al. | 357/23 X |
| 3,704,384 | 11/1972 | Desimone | 357/23 X |
| 3,753,132 | 8/1973 | Hill | 307/251 X |
| 3,808,458 | 4/1974 | Mundy et al. | 307/251 X |
| 3,859,545 | 1/1975 | Clemons et al. | 307/251 X |

OTHER PUBLICATIONS

Rossero, "Analog Switch With Gating Spike Suppression;" IBM Tech. Discl. Bull.; vol. 14, No. 9, pp. 2825–2826; 2/1972.

Crider, "Resetting Circuit;" IBM Tech. Discl. Bull.; vol. 12, No. 10, pp. 1601; 3/1970.

*Primary Examiner*—Stanley D. Miller, Jr.
*Assistant Examiner*—L. N. Anagnos
*Attorney, Agent, or Firm*—Alan H. MacPherson; Henry K. Woodward; J. Ronald Richbourg

[57] ABSTRACT

According to the invention, the electrical charge which is transferred to a circuit node by the switching ON or OFF of a field effect transistor whose source or drain is connected to that node is cancelled by connecting the source and drain of another field effect transistor to that circuit node and applying to its gate terminal a complement of the switching signal applied to the gate electrode of the first field effect transistor.

3 Claims, 6 Drawing Figures

CHARGE CANCELLING STRUCTURE AND METHOD FOR INTEGRATED CIRCUITS

BACKGROUND OF THE INVENTION

1. Field of the Invention

This invention relates to integrated circuits and in particular to a structure for accurately cancelling electrical charge which is transferred to a circuit node by the switching "ON" or "OFF" of a field effect transistor whose drain or source is connected to that node and to the method of operating such a structure. More particularly, this invention makes possible a significant increase in the accuracy with which unwanted charge transferred by the application or removal of a gate voltage to a field effect transistor is cancelled.

2. Prior Art

In a transistor switch of the prior art (FIG. 1) incorporating an MOS transistor between an input terminal A and an output terminal B, the application of a gate voltage, such as voltage $V_{g1}$, to the gate G1 of the transistor results in the transfer of charge within the semiconductor material in which the source, drain, and channel region are formed. To the extent this charge reaches the drain D1 of the MOS transistor and thus appears on the output terminal B, this charge represents noise or unwanted distortion in the signal on the output terminal B. To cancel this charge, a capacitor C1 was provided with one of its leads connected to the output terminal B and the other of its leads being connected to a voltage which was the complement of the gate voltage used to drive the MOS transistor. While this structure resulted in a portion of the unwanted charge being cancelled by an opposite charge on the capacitor, the design limitations on the structures were such that it was difficult to obtain precise charge cancellation. This problem was made more difficult by manufacturing tolerances and variations, and by the fact that the cancellation ideally should occur over the complete temperature range for which the transistor switch is designed to operate.

An attempt to solve this problem is illustrated in FIG. 2 where the capacitor C1 of FIG. 1 is replaced by another MOS transistor Q2 designed to match the transistor Q1. The drain of transistor Q2 is connected to terminal B of the circuit while the source of transistor Q2 is allowed to float. Application of a gate voltage $V_{g1}$ to gate G1 of transistor Q1 occurred simultaneously with the application of a gate voltage $V_{g2}$, complementary to $V_{g1}$, to the gate G2 of the transistor Q2. The induced charge transferred to the drain D1 of transistor Q1 was then approximately cancelled by a charge of opposite polarity in the drain D2 of transistor Q2. However, difficulties arose with the circuit of FIG. 2 in that when transistor Q2 was in the OFF stage the source S2 of transistor Q2 gradually assumed the potential of the bulk semiconductor material because of leakage current flowing across the source-bulk junction. Accordingly, when the gate voltage $V_{g2}$ was applied to transistor Q2, not only was a charge transferred to the drain D2 but additional charge had to be transferred to bring the source S2 back to the potential on the output terminal B. The accuracy with which the induced charge present in drain D1 was cancelled by the charge in drain D2 thus depended upon the time between application of the gate voltages $V_{g1}$ and $V_{g2}$ to the gates G1 and G2. Thus the accuracy of the circuit was dependent upon the time interval between switching events, the bulk bias voltage, and temperature (because the leakage current from source S2 to the bulk material was temperature dependent). To overcome this problem the prior art eliminated the source region from the charge cancelling transistor thereby leaving only the drain region D2 as in FIG. 3. However, even that structure gave imprecise cancelling due to an extra capacitance associated with the extension of the gate over the region of semiconductor material in which the source region would formerly have been formed.

SUMMARY OF THE INVENTION

This invention overcomes the above difficulties of the prior art by providing a charge cancelling MOS transistor with characteristics which are precisely matched to the characteristics of the drain region of the switching transistor. The charge cancelling transistor of this invention makes possible the precise cancellation of the charge induced in the drain region of the switching transistor over the complete operating temperature range of the switching transistor and for the normal range of bulk bias voltages of both the switching transistor and the charge cancelling transistor.

In accordance with this invention the charge cancellation transistor comprises a transistor identical in design to the switching transistor except for the fact that the channel region between the source and the drain regions is made a fraction of the size of the channel region of the switching transistor so as to ensure exact cancellation of the unwanted charge induced in the drain region of the switching transistor. Typically, the channel region of the charge cancelling transistor is made approximately one-half the width of the channel region of the switching transistor to reflect the fact that the charge induced in both the source and the drain of the charge cancelling transistor is used to cancel the charge induced in the drain of the switching transistor.

In the method of operating the structure of this invention, a gate voltage which is the complement of the gate voltage applied to the switching transistor, is applied to the gate of the charge cancelling transistor. This ensures that for a charge of one magnitude and polarity transferred to the drain region of the switching transistor, a charge of the same magnitude but opposite polarity is transferred to the source and drain regions of the charge cancelling transistor.

DETAILED DESCRIPTION

Figure 1:
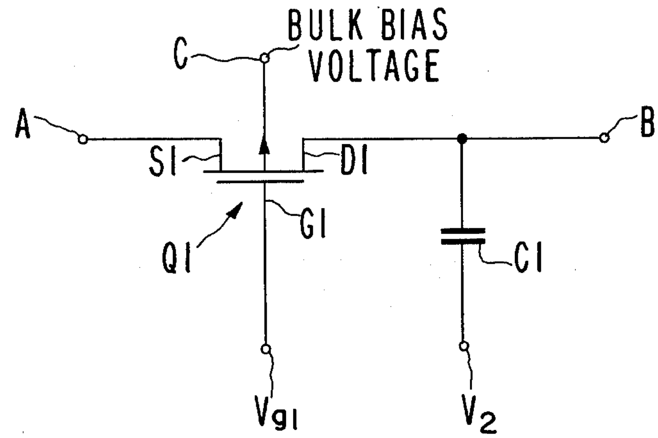
FIGS. 1, 2 and 3 illustrate structures of the prior art.
Figure 2:
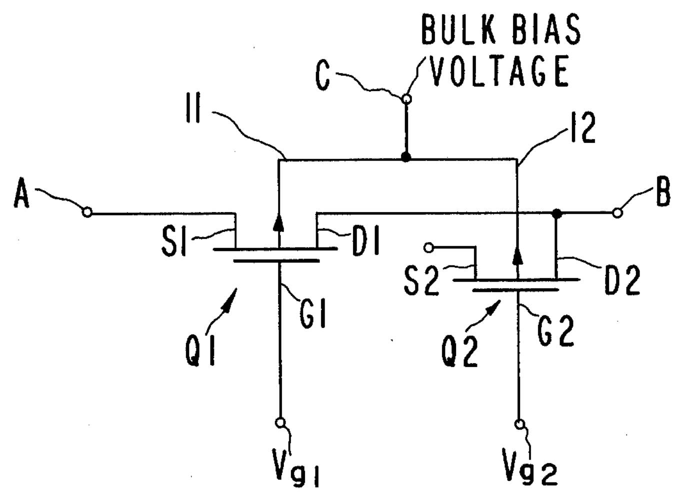
Figure 3:
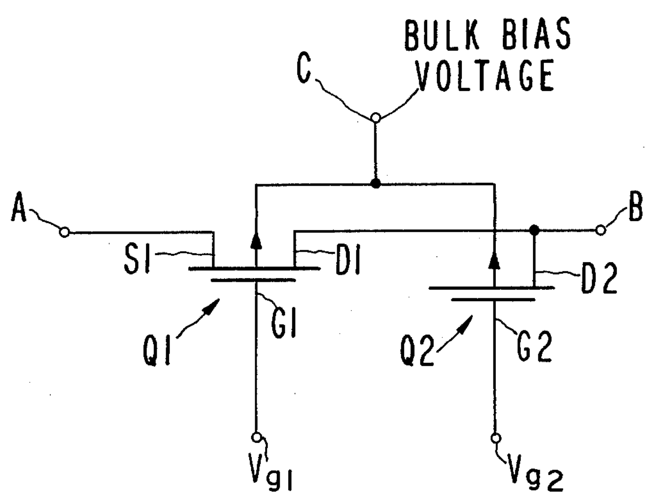
Figure 4:
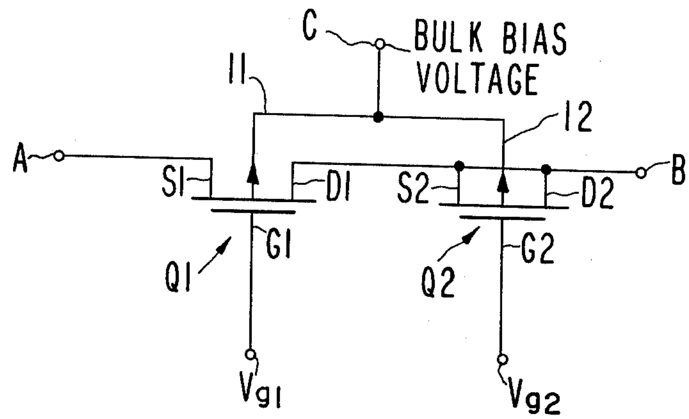
FIG. 4 illustrates the structure of this invention comprising the switching transistor and the charge cancelling transistor.

As shown in FIG. 4, switching transistor Q1 comprises an MOS transistor containing a source region S1, a drain region D1 and a gate G1. The input terminal A to the circuit is connected to source S1. Drain D1 is connected to an output terminal B. Terminal C is provided to allow a bulk bias voltage to be applied to the substrates of MOS transistor Q1 and Q2. Leads 11 and 12 connect terminal C to the substrates of these two transistors. Transistor Q2, containing source S2, drain D2 and gate G2 is provided with its source S2 and drain D2 connected directly to output terminal B. Gate G2 is attached to a terminal for receipt of the gate voltage $V_{g2}$.

Figure 5:
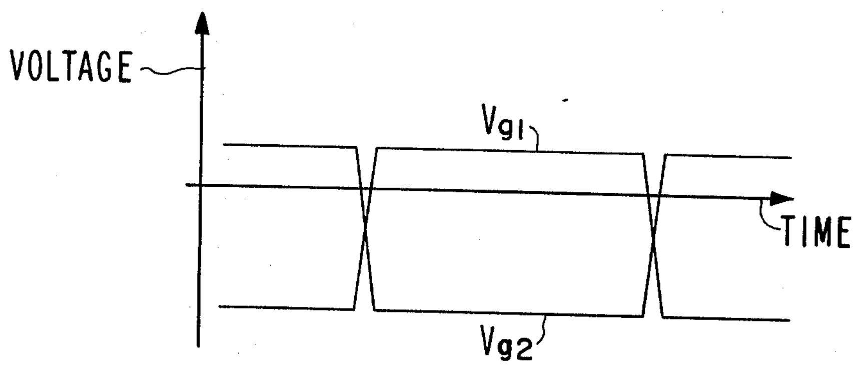
FIG. 5 illustrates the switching signal waveforms applied to the gates of the two transistors Q1 and Q2 shown in FIG. 4.

FIG. 5 shows switching signals applied to the gates G1 and G2 of transistors Q1 and Q2. The voltage $V_{g1}$ is applied to the gate G1 of transistor Q1. Voltage $V_{g2}$, the complement of voltage $V_{g1}$, is applied to the gate G2 of transistor Q2. The application of voltage $V_{g1}$ to the gate G1 of transistor Q1 results in a charge $q_{b1}$ appearing in the drain region D1 of transistor Q1. Simultaneously, the application of voltage $V_{g2}$ of opposite polarity to the gate G2 of transistor Q2 results in a total charge $q_{b2}$ appearing in the source S2 and the drain D2 of transistor Q2. By making the gate-to-drain plus the gate-to-source capacitance of transistor Q2 equal to the gate-to-drain capacitance of transistor Q1, the charge $q_{b1}$ can be made to be equal in magnitude but opposite in polarity to the charge $q_{b2}$. Accordingly, these charges cancel and the output signal on output terminal B appears in its undistorted form as it appeared on the input terminal A. By doing a mathematical analysis of the capacitances associated with the drain D1 of transistor Q2 and the source S2 and drain D2 of transistor Q2, it can be shown that for this cancellation to be exact, the capacitance associated with the source region of transistor Q2 or with the drain region of transistor Q2 must each be one-half the capacitance associated with the drain region of transistor Q1. This can be achieved by varying the channel width or the channel length associated with the channel of transistor Q2. Typically, the proper capacitance of transistor Q2 is obtained by making the channel width of transistor Q2 one-half the channel width of transistor Q1. Alternatively, the channel length or some combination of channel length and channel width can be varied but the cancellation is less precisely controlled by varying the length. Accordingly, the preferred embodiment varies the channel width. Other parameters such as gate insulation thicknesses and source, drain and channel region sizes can also be varied if desired to achieve the same result.

Figure 6:
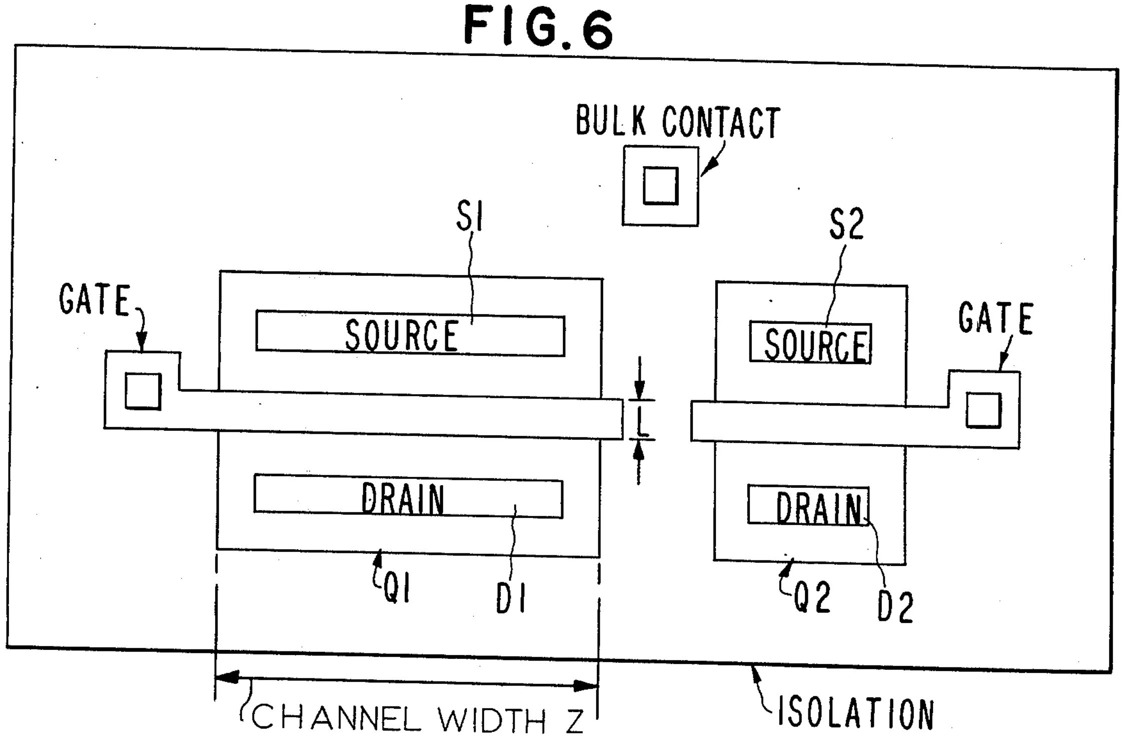
FIG. 6 shows the top view of the layout of the structure of FIG. 4 as an integrated circuit in a single piece of semiconductor material.

A plan view of the circuit shown in FIG. 4 formed as an integrated circuit in a piece of semiconductor material is shown in FIG. 6. The structure of FIG. 6 shows a typical layout of the contacts to the source S1 and drain D1 of the transistor Q1, and to the source S2 and drain D2 of transistor Q2. As is apparent from the plan view, the source S2, drain D2 and channel region in the semiconductor material between the source S2 and drain D2 of transistor Q2 are approximately one-half the size of the source S1, drain D1 and channel region of transistor Q1. The gate contacts and gate regions are shown in outline form between the source and drain regions of these two transistors. Surrounding the two MOS transistors Q1 and Q2 in a typical MOS structure is bulk semiconductor material of a conductivity type opposite to that of the source and drain regions of Q1 and Q2. Additionally, if desired, isolation regions can be formed around these two transistors to isolate them from other functioning components in the circuit.

The advantages of the charge cancelling structure and method of this invention are that high cancellation accuracy is achieved with no trimming of individual circuits; the cancellation accuracy is nearly independent of temperature and production variations in field effect transistor parameters; and cancellation accuracy is unaffected by the length of time the circuit is either ON or OFF. Additionally, the charge cancellation transistor can be easily formed on the same piece of semiconductor material with the switching transistor. When microminiature techniques are applied to the two transistors, charge cancellation is obtained using very little semiconductor material for the charge cancellation transistor.

While the above embodiment was illustrated using MOS transistors, this invention can also be used with junction FET transistors in those circumstances where the FET's back gate is separated from the top or controlling gate.

Other embodiments of this invention will be obvious to those skilled in the semiconductor switching arts in view of the above disclosure.

What is claimed is:

1. An MOS switching circuit comprising;

an input terminal;

an output terminal;

a first MOS transistor comprising a source region and a drain region formed in semiconductor material and separated from each other by a channel, and a first gate electrode separated by insulation from the channel, said source being connected to said input terminal and said drain being connected to said output terminal;

A second MOS transistor containing a source region and a drain region formed in semiconductor material and separated from each other by a second channel and both said source region and said drain region being connected to said output terminal, and a second gate electrode separated by insulation from said second channel; and means for simultaneously applying a first gate voltage to the first gate electrode and a second gate voltage to the second gate electrode, said second gate voltage being the complement of said first gate voltage;

wherein the charge induced in the source and drain regions of said second MOS transistor by the application of said second gate voltage to the second gate electrode is approximately equal in magnitude but opposite in polarity to the charge induced in the drain region of said first MOS transistor by the application of said first gate voltage to the first gate electrode.

2. Structure as in claim 1 wherein the channel width of said second MOS transistor is approximately one-half the channel width of said first MOS transistor.

3. The method of operating a transistor switching circuit comprising a first MOS switching transistor and a second MOS charge cancelling transistor wherein said second MOS charge cancelling transistor possesses a source and drain region each connected to the drain of said first MOS switching transistor, comprising the steps of:

1. applying a first gate voltage to the gate of said first MOS transistor; and
2. simultaneously applying a second gate voltage, the complement of said first gate voltage, to the gate of said second MOS transistor thereby to cancel any charge induced by said first gate voltage in the drain of said first MOS transistor by a charge equal in magnitude but opposite in polarity induced in the source and drain regions of said second MOS transistor.

* * * * *